US007491290B2

(12) United States Patent
Matsushima et al.

(10) Patent No.: US 7,491,290 B2
(45) Date of Patent: Feb. 17, 2009

(54) TWO-PACK TYPE ADHESIVE

(75) Inventors: Takayuki Matsushima, Tochigi (JP);
Masao Saito, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 330 days.

(21) Appl. No.: 10/505,489

(22) PCT Filed: Feb. 14, 2003

(86) PCT No.: PCT/JP03/01593

§ 371 (c)(1),
(2), (4) Date: Aug. 20, 2004

(87) PCT Pub. No.: WO03/070850

PCT Pub. Date: Aug. 28, 2003

(65) Prior Publication Data

US 2005/0096432 A1 May 5, 2005

(30) Foreign Application Priority Data

Feb. 21, 2002 (JP) ............................ 2002-044240

(51) Int. Cl.
*C09J 163/00* (2006.01)
*B32B 27/38* (2006.01)

(52) U.S. Cl. ..................... 156/310; 156/330; 428/413; 428/414; 525/523; 528/92

(58) Field of Classification Search .................. None
See application file for complete search history.

(56) References Cited

U.S. PATENT DOCUMENTS 4,831,063 A  5/1989  Suzuki et al. ............... 522/13

4,954,354 A  9/1990  Hopkins ..................... 426/8

FOREIGN PATENT DOCUMENTS

| JP | 56-18643 A | * | 2/1981 |
| JP | 60-71631 | | 4/1985 |
| JP | 64-29384 | | 1/1989 |
| JP | 7-26235 | | 1/1995 |
| JP | 7-82533 | | 3/1995 |
| JP | 09-255759 | | 9/1997 |
| JP | 9-291260 | | 11/1997 |
| JP | 11-343474 | * | 12/1999 |
| JP | 2000-230091 | | 8/2000 |
| JP | 2001-002893 | | 1/2001 |
| JP | 2001-303013 | | 10/2001 |

OTHER PUBLICATIONS

Patent Abstracts of Japan for JP Publication No. 09-255759 dated Sep. 30, 1997 (1 page).
Patent Abstracts of Japan for JP Publication No. 2001-002893 dated Jan. 9, 2001 (1 page).
Japanese Office Action dated Mar. 18, 2008, issued in JP Patent Application No. 2002-044240 (5 pages).
Decision to Grant Japanese Patent, issued in JP Patent Application No. 2002-044240 dated Jul. 22, 2008 (English Translation attached) (6 pages).

* cited by examiner

*Primary Examiner*—Marc S Zimmer
(74) *Attorney, Agent, or Firm*—Osha•Liang LLP

(57) ABSTRACT

Disclosed is a two-component adhesive used for electrically and mechanically interconnecting two objects for bonding. The two-component adhesive is made up by first and second adhesive materials separately containing first and second curing agents, respectively. It is only after reaction of the first and second curing agents that the first and second resin components are polymerized. As long as the two adhesive materials are isolated from each other, the adhesive is not cured. In case a metal chelate or a metal alcoholate is used as the first curing agent and a silane coupling agent is used as the second curing agent, cations as a curing component are isolated to cause cationinc polymerization of the first and second resin components to allow for curing at a lower temperature in a shorter time than in case a conventional adhesive is used.

12 Claims, 6 Drawing Sheets

TWO-PACK TYPE ADHESIVE

TECHNICAL FIELD

This invention relates to an adhesive and, more particularly, to an adhesive used for electrically or mechanically connecting a semiconductor chip or a TCP to a substrate by thermo-compression bonding.

This application claims priority based on the Japanese Patent Application 2002-044240, filed in Japan on Feb. 21, 2002, the entirety of which is incorporated by reference herein.

BACKGROUND ART

Conventionally, a thermally curing adhesive, containing an epoxy resin, as a thermosetting resin, and which is cured on thermal polymerization of the epoxy resin, is used as an adhesive used for bonding objects for bonding, such as a semiconductor or a substrate, to prepare an electrical device.

For accelerating the reaction of thermal polymerization of the epoxy resin, a curing agent is routinely used in an adhesive. As this sort of the curing agent, a curing agent functioning as a polymerization catalyst for an epoxy resin, such as an imidazole compound, or a curing agent, which per se undergoes an additive reaction with an epoxy resin to form a polymer, such as a mercaptan compound or an amine compound, is widely used.

In case the imidazole compound is used as a curing agent, the adhesive may be cured in a short time. However, in this case, the adhesive needs to be heated to an elevated temperature exceeding 180° C., such that the objects for bonding may be subjected to deformation, such as elongation or bend, due to heating.

In case the amine compound or the mercaptan compound is used as a curing agent, the adhesive may be cured at a lower temperature. However, in this case, the time needed for the adhesive to be cured is longer than with the imidazole compound, thus lowering the productivity. With the adhesive cured at a lower temperature, the polymerization reaction proceeds even at an ambient temperature, and hence the adhesive is appreciably inferior in shell life. It has so far been difficult to obtain an adhesive cured at a lower temperature in a shorter time and which nevertheless has a long shell life.

DISCLOSURE OF THE INVENTION

It is an object to provide an adhesive with which it is possible to resolve the problem inherent in the aforementioned conventional adhesive.

It is another object to provide an adhesive having a long shell life and which may be cured at a lower temperature in a shorter time.

For accomplishing the above objects, the present invention provides a two-component adhesive comprising a first adhesive material, mainly composed of a first resin component, added by a first curing agent, a second adhesive material, mainly composed of a second resin component, added by a second curing agent. On contact of the first adhesive material with the second adhesive material, the first and second curing agents react with each other to cause a chain reaction of curing components, with the curing components causing polymerization of the first and second resin components.

With the two-component adhesive, according to the present invention, at least one of the first and second adhesive materials is shaped as a film.

With the two-component adhesive, according to the present invention, at least one of the first and second adhesive materials is paste-like.

With the two-component adhesive, according to the present invention, the first and second resin components are mainly composed of the same sort of the resin. The resin as the main component of the first and second resin components is an epoxy resin.

The curing agent of one of the first and second curing agents, used in the two-component adhesive, according to the present invention, is mainly composed of a silane coupling agent, while the other is mainly composed of the metal chelate and/or the metal alcoholate The metal chelate, forming the other curing agent, may be aluminum chelate. The metal chelate forming the other curing agent, may be aluminum alcoholate.

With the two-component adhesive, according to the present invention, electrically conductive particles may be added to at least one of the first and second adhesive materials.

With the two-component adhesive according to the present invention, in which the first and second resin components are polymerized by the reaction of the first and second curing agents to yield the curing components, no curing of the first and second resin components occurs as long as the first and second adhesive materials are isolated from each other.

In a routine two-solution adhesive, the curing agent and the resin component need to be mixed together prior to use. Following the mixing, the polymerization reaction proceeds immediately, and hence the adhesive following the mixing is inferior in shell life. With the two-component adhesive, according to the present invention, when the first and second adhesive materials are affixed or coated on separate objects for bonding, and the first adhesive material on one of the objects for bonding is brought into contact with the second adhesive material on the other object for bonding, the first and the second curing agents are reacted with each other on the interface of the first and second adhesive materials to isolate curing components. By the so isolated curing components, the first and second resin components may be polymerized in the manner of a chain reaction. Thus, with the two-component adhesive, according to the present invention, there is no necessity of mixing the first and second adhesive materials before use of the adhesive. The first and second resin components are not polymerized until directly prior to affixing the objects for bonding.

The first and second resin components, making up the two-component adhesive of the present invention, may be used in the present invention if the resin components copolymerize with each other. However, if the first and second resin components used are such that these components are independently copolymerizable by curing components, the polymerization reaction may proceed even if the first and second adhesive materials are not commingled completely.

If the same sort of the resin is used as the first and second resin components, not only are the first and second adhesive materials readily miscible, but also the differential in the thermal expansion coefficient between the first and second adhesive materials becomes smaller. Hence, the internal stress produced on the interface of the first and second adhesive materials is reduced, with the result that there scarcely occurs the interface destruction of the first and second adhesive materials in the cured state.

In case the first and second adhesive materials exhibit high viscosity, or are in the shape of films, the second object for bonding may be thrust as the first and second adhesive materials are heated. In this case, the first and second adhesive materials are softened on heating, so that the first and second adhesives become more readily miscible with each other.

The reaction in which the silane coupling agent and the metal chelate are used as the first and second curing agents, and the epoxy resin is used as the thermosetting resin, is expressed by the following reaction formulas (1) to (4):

reaction formula (1)
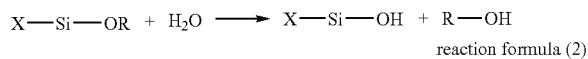

reaction formula (2)
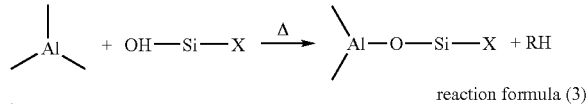

reaction formula (3)
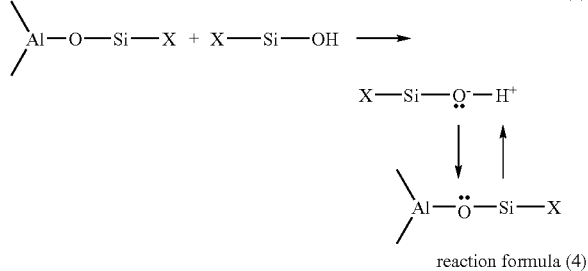

reaction formula (4)
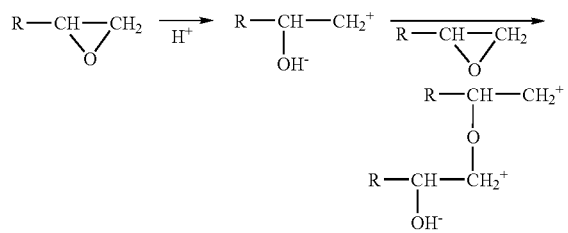

The silane coupling agent, indicated on the left side of the reaction formula (1), has an alkoxy group (RO) linked to silicon. If the silane coupling agent is contacted with water contained in atmosphere or in an adhesive, the alkoxy group is hydrolyzed to yield silanol (right side of the reaction formula (1)).

An aluminum chelate, as a metal chelate, is indicated on the left side of the reaction formula (2), by way of an example. A ligand R is linked to aluminum (Al) as a center metal of the aluminum chelate.

If, as the silane coupling agent and the metal chelate are mixed together, the first and second adhesive materials are heated, the silanol, yielded on hydrolysis of the silane coupling agent, is reacted with the aluminum chelate, due to heating, so that silicon of the silanol is linked to aluminum through an oxygen atom (right side of the reaction formula (2)).

If another silanol is coordinated to the aluminum chelate in this state by an equilibrium reaction, a Bronsted acid point is produced, as indicated on the right side of the reaction formula (4), to yield an activated proton.

As indicated by the reaction formula (4), the epoxy ring, disposed at a terminal end of the epoxy resin, is opened by the activated proton and polymerized with an epoxy ring of another epoxy resin.

Since the reaction by the reaction formulas (2) and (3) proceeds at a temperature lower than the curing temperature of a conventional adhesive (180° C. or higher), the two-component adhesive according to the present invention is cured at a lower temperature in a shorter time than with a conventional adhesive.

If the silane coupling agent is used as the first and second curing agents, the reaction of polymerization of resin components proceeds more promptly by adding water to the silane coupling agent to cause hydrolysis at the outset.

Other objects and advantages of the present invention will become more apparent from the following description especially when read in conjunction with the drawings.

BEST MODE FOR CARRYING OUT THE INVENTION

A two-component adhesive, according to the present invention, is now explained in detail.

For producing the two-component adhesive, according to the present invention, a first curing agent, formed by a silane coupling agent, and electrically conductive particles, are added to and mixed with a first resin component, formed of a thermosetting resin, for example, epoxy resin, to produce a first adhesive material. In this state, the first adhesive material is paste-like.

Apart from the first adhesive material, a second curing agent, formed of a metal chelate or a metal alcoholate, and electrically conductive particles, are added to and mixed with a second resin component, formed of the same material as that of the first resin component, that is, epoxy resin, to form a paste-like second adhesive material.

The first adhesive material contains the silane coupling agent, as a curing agent, while the second adhesive material contains metal chelate, as a curing agent. However, since the first adhesive material and the second adhesive material are kept isolated from each other to inhibit contact between the silane coupling agent of the first adhesive material and the metal chelate of the second adhesive material, no curing component is produced. Thus, as long as the first and second adhesive materials are kept isolated from each other, the first resin component is not polymerized with the second resin component, so that the two-component adhesive according to the present invention is not cured.

Figure 1:
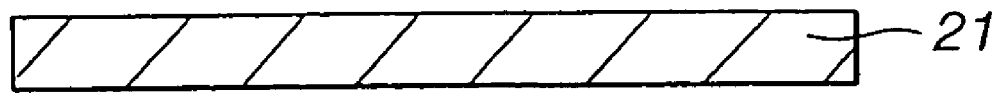
FIG. 1 is a cross-sectional view showing a release film having a first adhesive material or a second adhesive material formed as an adhesive film on the film surface.
Figure 2:
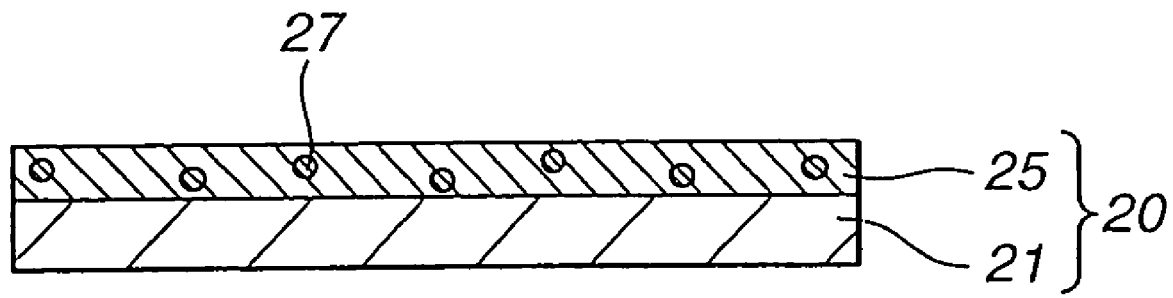
FIG. 2 is a cross-sectional view showing a first adhesive sheet having a release film on the surface of which a first adhesive film has been formed.

The paste-like first and second adhesive materials, forming the two-component adhesive according to the present invention, are then coated in preset amounts on the surface of a release film 21, shown in FIG. 1, and subsequently dried in situ. The first adhesive material, coated to the surface of the release film 21, and subsequently dried, is then shaped as a first adhesive film 25 on the surface of the release film 21, as shown in FIG. 2. In similar manner, the second adhesive material, coated to the surface of the release film 21, and subsequently dried, is then shaped as a second adhesive film 35 on the surface of the release film 21, as shown in FIG. 3.

Figure 3:
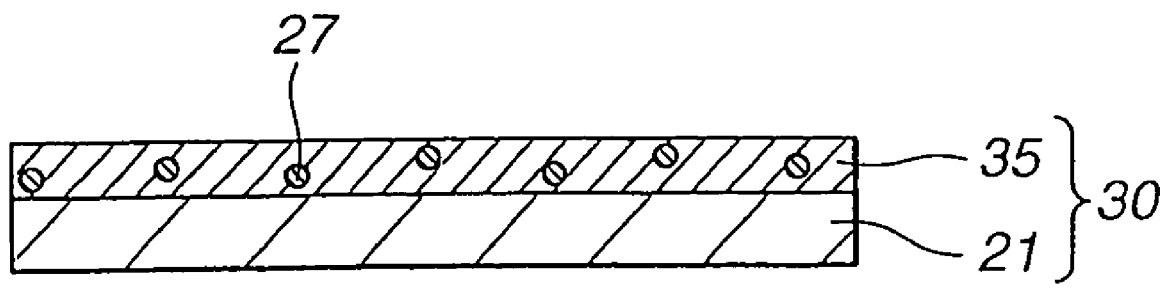
FIG. 3 is a cross-sectional view showing a second adhesive sheet having a release film on the surface of which a second adhesive film has been formed.

Within the bulk of the first adhesive film 25 and the second adhesive film 35, formed on the surface of the release film 21, there are dispersed electrically conductive particles 27, as shown in FIGS. 2 and 3. When bonded together, the release film 21 and the first adhesive film 25, formed thereon, make up a first adhesive sheet 20. When bonded together, the release film 21 and the second adhesive film 35, formed thereon, similarly make up a second adhesive sheet 30, as shown in FIG. 3.

Thus, according to the present invention, the first adhesive film 25, formed of a first adhesive material, and the second adhesive film 35 are discretely formed on the surface of the release film 21 to form the first adhesive sheet 20 and the second adhesive sheet 30, respectively, thus prohibiting the first and second resin components from contacting with each other to inhibit polymerization.

The objects of bonding to be bonded together using the two-component adhesive according to the present invention, are hereinafter explained.

The objects of bonding, to be bonded together using the two-component adhesive according to the present invention, may be enumerated by an LCD (liquid crystal display) 11 and a TCP (tape carrier package) 15 to which is bonded the LCD 11.

To the LCD 11, as an object for bonding, the first adhesive sheet 20 is bonded. To the TCP, as the other object of bonding, the second adhesive sheet 30 is bonded.

Figure 4:
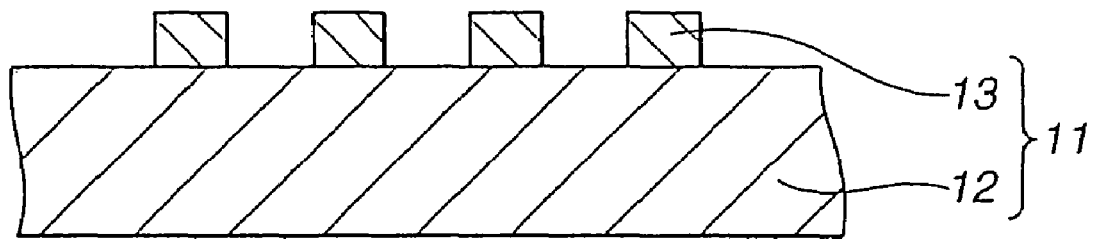
FIG. 4 is a cross-sectional view showing an LCD as a object of bonding.

The LCD 11, to which is bonded the first adhesive sheet 20, includes a glass substrate 12, as shown in FIG. 4. A plural number of first electrodes 13 are formed on the surface of the glass substrate 12. In the example shown in FIG. 4, four of the first electrodes 13 are shown.

Figure 5:
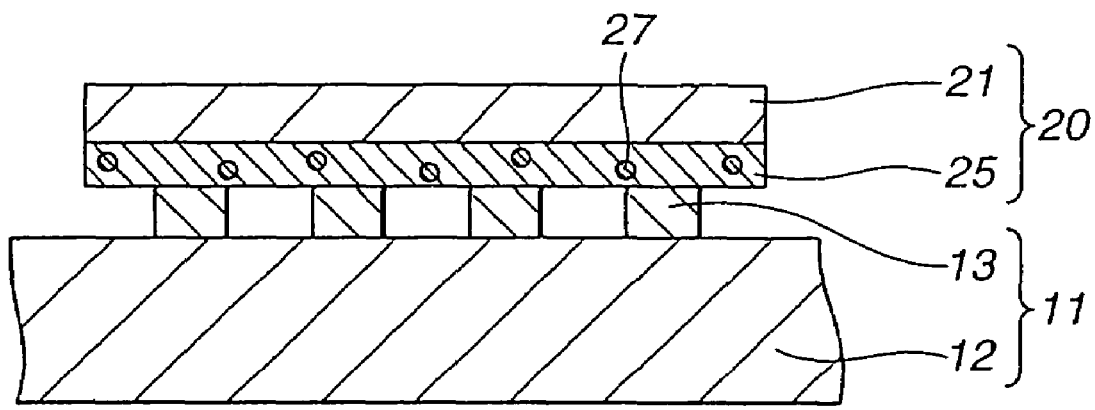
FIG. 5 is a cross-sectional view showing the state in which a first adhesive sheet has been mounted on the surface of the LCD.

On the surface of the LCD 11, carrying the first electrodes 13, the first adhesive sheet 20 is arranged in superposition on the first electrodes 13, as shown in FIG. 5. It is noted that the first adhesive sheet 20 is arranged on the LCD 11, with the first adhesive film 25 facing the surface of the LCD 11 carrying the first electrodes 13, and is thrust against the first electrodes 13.

Figure 6:
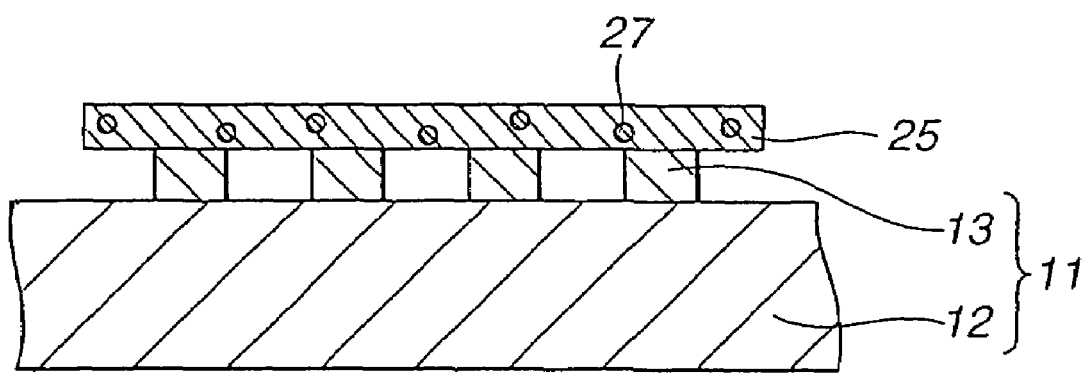
FIG. 6 is a cross-sectional view showing the state in which a release film of the first adhesive sheet mounted on the LCD has been peeled off.

Meanwhile, since the adhesive force between the LCD 11 and the first adhesive film 25 is larger than that between the release film 21 and the first adhesive film 25, only the release film 21 may be peeled off, as the first adhesive film 25 is left on the LCD 11, as shown in FIG. 6. When the release film 21 has been peeled off, the first adhesive film 25 has been deposited to overlie the first electrodes 13, as shown in FIG. 6.

Figure 7:
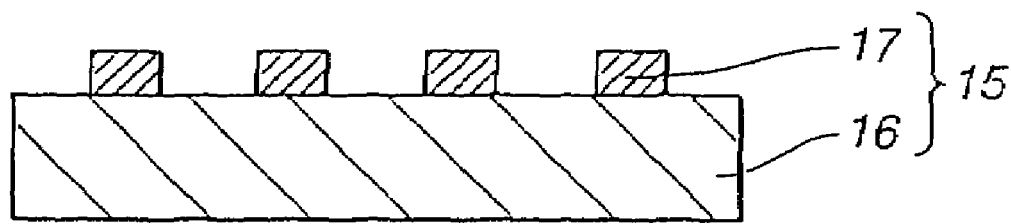
FIG. 7 is a cross-sectional view showing a TCP, as the other object of bonding.

The TCP 15, to which is bonded the second adhesive sheet 30, includes a base film 16, and a plural number of second electrodes 17 are formed on the surface of the base film 16, as shown in FIG. 7. In the example shown in FIG. 7, four of the second electrodes 17 are shown.

Figure 8:
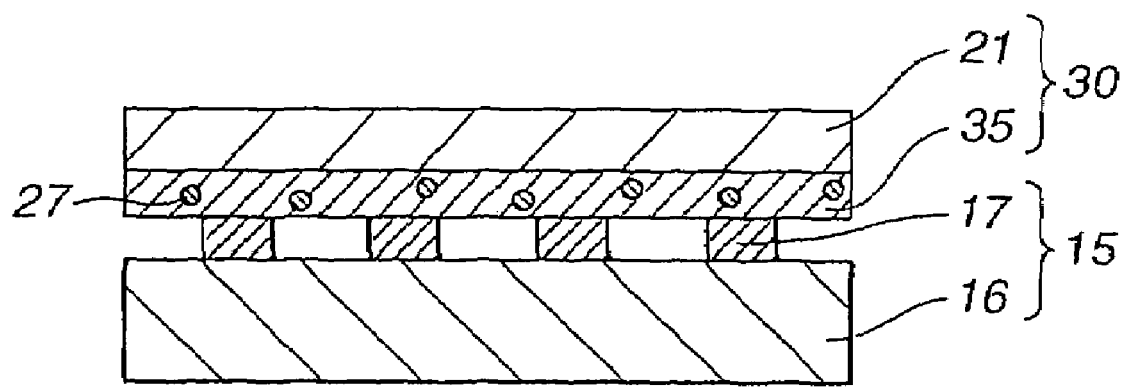
FIG. 8 is a cross-sectional view showing the state in which a second adhesive sheet has been mounted on the surface of the TCP.

On the surface of the TCP 15, carrying the second electrodes 17, the second adhesive sheet 30 is arranged in superposition on the second electrodes 17, as shown in FIG. 8. It is noted that the second adhesive sheet 30 is arranged on the TCP 15, with the second adhesive film 35 facing the surface of the TCP 15 carrying the second electrodes 17, and is thrust against the second electrodes 17.

Figure 9:
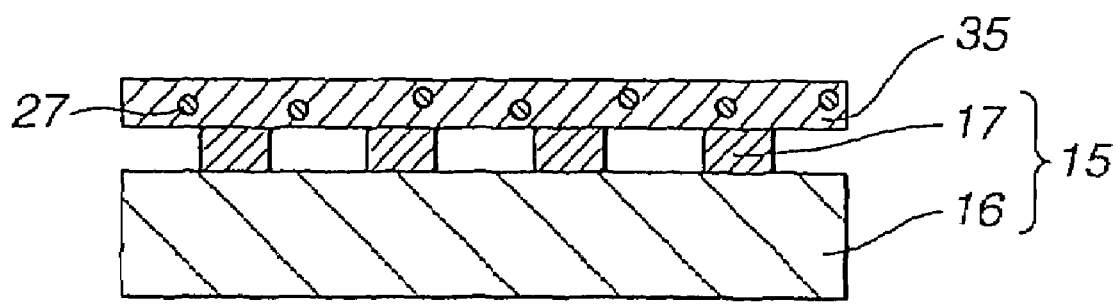
FIG. 9 is a cross-sectional view showing the state in which a release film of the second adhesive sheet mounted on the TCP has been peeled off.

Meanwhile, since the adhesive force between the TCP 15 and the second adhesive film 35 is larger than that between the release film 21 and the second adhesive film 35, only the release film 21 may be peeled off, as the second adhesive film 35 is left on the TCP 15, as shown in FIG. 9. When the release film 21 has been peeled off, the second adhesive film 35 has been deposited to overlie the first electrodes 13, as shown in FIG. 9.

Figure 10:
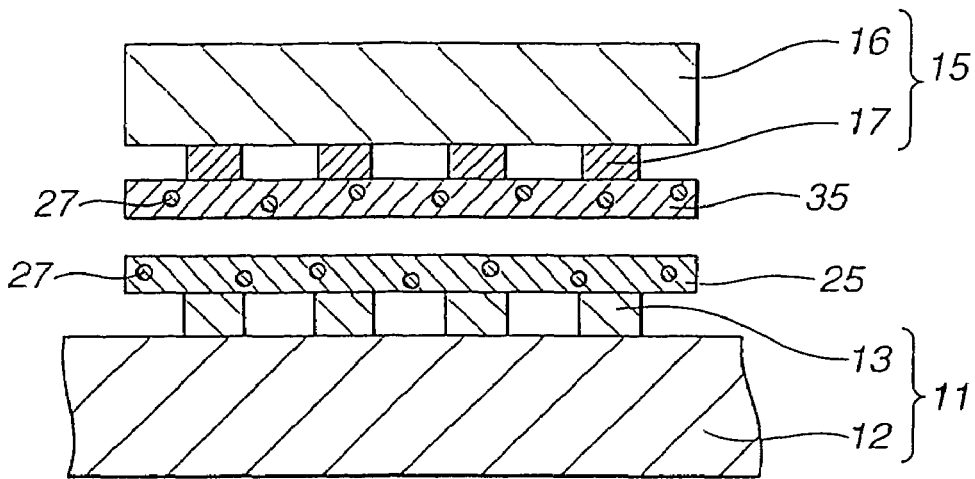
FIG. 10 is a cross-sectional view showing the state in which the LCD and the TCP, to be bonded together, are placed in position for facing each other.

For bonding and unifying the LCD 11, as one of the objects for bonding, and the TCP 15, as the other of the objects for bonding, carrying the first and second adhesive films 25, 35 bonded thereto, respectively, the LCD and the TCP are arranged parallel to each other, with the sides thereof carrying the deposited first and second adhesive films 25, 35 facing each other, as shown in FIG. 10. It is noted that the LCD 11 and the TCP 15 are positioned so that the plural first electrodes 13 and the plural second electrodes 17 are positioned facing each other, as shown in FIG. 10.

Figure 11:
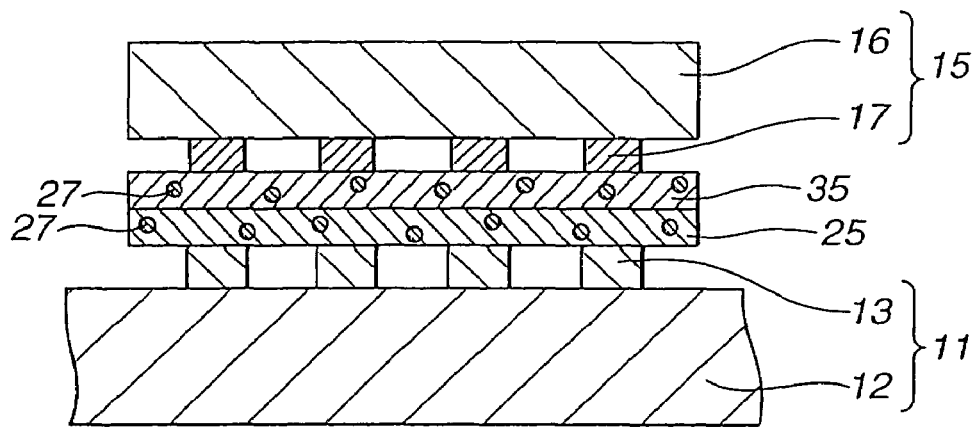
FIG. 11 is a cross-sectional view showing the state in which the LCD and the TCP have been abutted to each other.

The TCP 15 is then thrust against the LCD 11 to bring the second adhesive sheet 35 on the TCP 15 and the first adhesive film 25 on the LCD 11 into tight contact with each other, as shown in FIG. 11.

Figure 12:
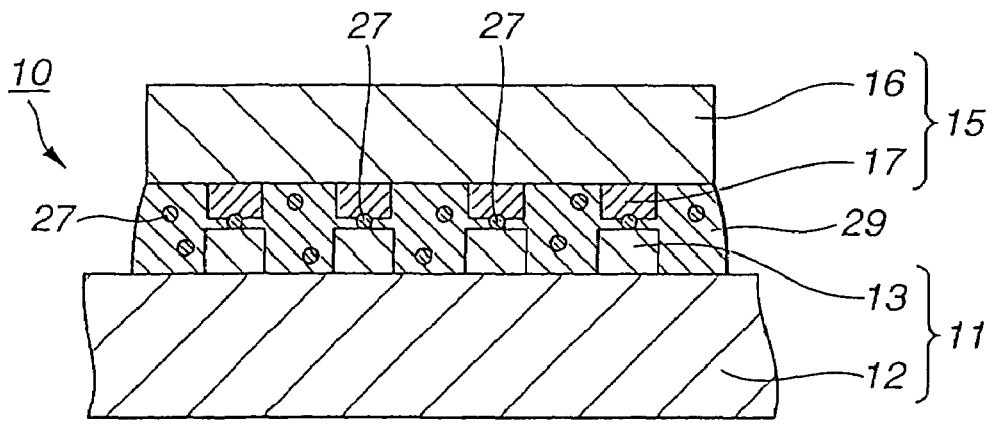
FIG. 12 is a cross-sectional view showing the state in which the LCD and the TCP have been bonded together.
Figure 13:
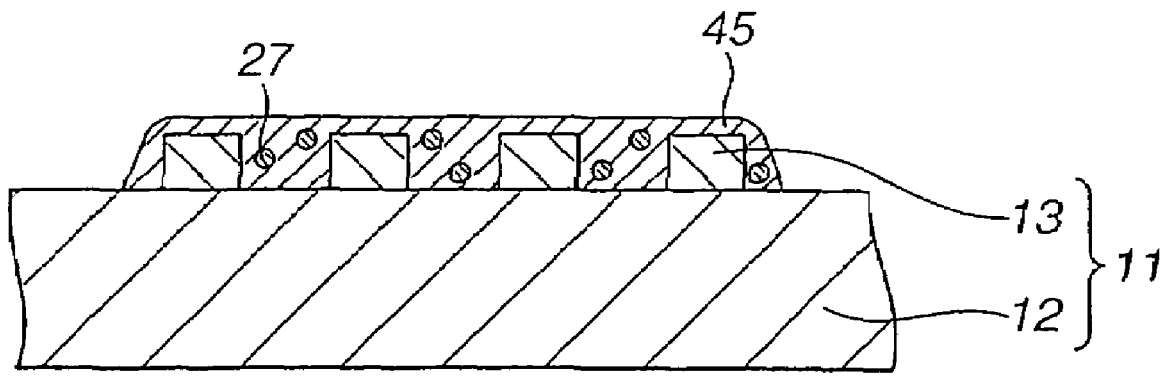
FIG. 13, showing another example of a two-component adhesive according to the present invention, is a cross-sectional view showing the state in which a first adhesive material is coated on a surface of the TCP carrying a first electrode to form a first coating layer.
Figure 14:
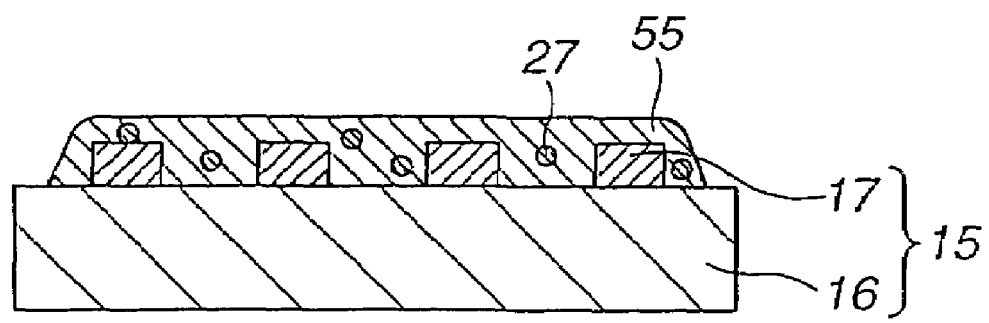
FIG. 14, showing still another example of a two-component adhesive according to the present invention, is a cross-sectional view showing the state in which a second adhesive material is coated on a surface of the TCP carrying a second electrode to form a second coating layer.

The TCP 15 and the LCD 11 in their entirety are then heated, as the TCP 15 is thrust against the LCD 11. This softens the first and second adhesive films 25, 35. Since the TCP 15 is thrust against the LCD 11, the second electrodes 17 are intruded into the bulk of the softened first and second adhesive films 25, 35. With these first and second adhesive films 25, 35 tightly contacted with each other and softened, the first and second adhesive materials, forming the first and second adhesive films 25, 35, are fused and commingled together in an interfacing area, such that the first and second adhesive films 25, 35 are unified together, as shown in FIG. 12.

The TCP 15 is further thrust against the LCD 11, such that the second electrodes 17 are intruded into the bulk of the softened first and second adhesive films 25, 35. By so doing, the electrically conductive particles 27 are sandwiched between the second electrodes 17 and the first electrodes 13, as shown in FIG. 12. In the state shown in FIG. 12, heating of the TCP 15 and the LCD 11 is continued, as the TCP 15 is thrust against the LCD 11. This reacts the silane coupling agent contained in the first and second adhesive materials and metal chelates as a result of the heating to isolate cations as curing components to cause cationic polymerization of the epoxy resin that makes up the first and second resin components. By the polymerization of the epoxy resin, the first and second adhesive films 25, 35 in their entirety are cured in the unified state to form an adhesive layer 29 which bonds the TCP 15 and the LCD 11 together, as shown in FIG. 12. The TCP 15 and the LCD 11, bonded together by the adhesive layer 29, are electrically interconnected through the electrically conductive particles 27, while being mechanically interconnected via electrically conductive particles 27 to form an electrical device 10.

In the above example, the first and second adhesive materials are formed into films, only by way of illustration. The present invention may also be configured as follows:

A first adhesive material, carrying electrically conductive particles 27, dispersed therein, is coated on a surface of the LCD 11, as one of the objects for bonding, configured as shown for example in FIG. 4, carrying the first electrodes 13, so that the first adhesive material overlies the first electrodes 13, to form a first coating layer 45.

A second adhesive material, carrying electrically conductive particles 27, dispersed therein, is coated on a surface of the TCP 15, as the other of the objects for bonding, configured as shown for example in FIG. 7, carrying the second electrodes 17, so that the adhesive material overlies the second electrodes 17, to form a second coating layer 55.

Figure 16:
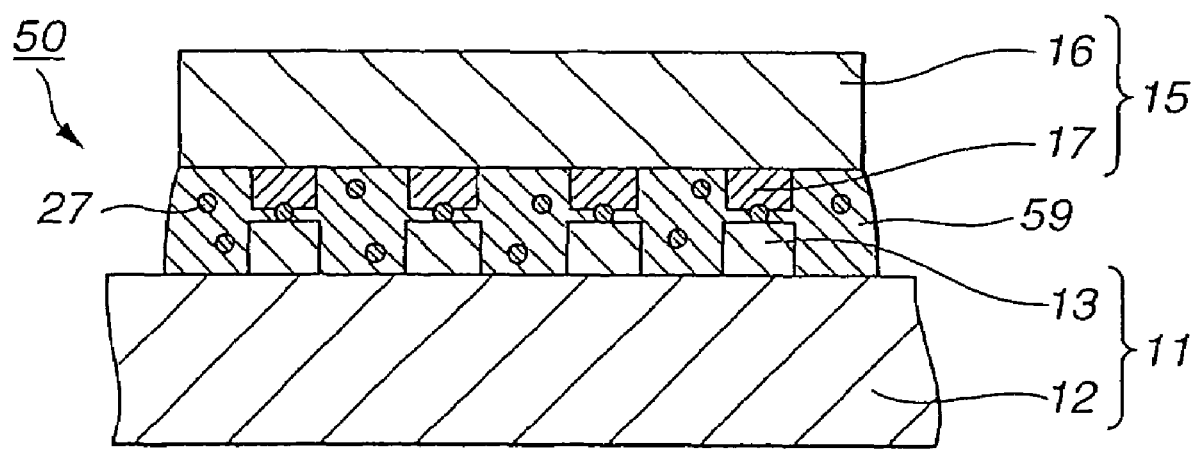
FIG. 16 is a cross-sectional view showing the state in which the LCD and the TCP have been bonded together.

For bonding and unifying the LCD 11, as one of the objects for bonding, and the TCP 15, as the other of the objects for bonding, carrying the first and second coating layers 45, 55, bonded thereto, respectively, the LCD and the TCP are positioned so that the first and second coating layers 45, 55 face each other and so that the plural first electrodes 13 and the plural second electrodes 17 face each other. The TCP 15 is then thrust against the LCD 11, the second coating layer 55 on the TCP 15 is brought into tight contact with the first coating layer 45 on the LCD 11, and the resulting assembly is heated as the TCP 15 is thrust against the LCD 11. The first and second coating layers 45, 55 are cured in the unified state to form an adhesive layer 59 which bonds the TCP 15 and the LCD 11 together, as shown in FIG. 16. The TCP 15 and the LCD 11, bonded together by the adhesive layer 59, are electrically interconnected by the electrically conductive particles 27, while being mechanically interconnected via the cured adhesive layer 59 to form an electrical device 10.

The present invention is explained with reference to several Examples of the two-component adhesive.

EXAMPLE 1

First, the Example 1 of the two-component adhesive according to the present invention is explained.

The first resin component, forming the two-component adhesive of Example 1, was prepared by mixing 40 parts by weight of alicyclic epoxy resin celoxide (manufactured and sold by DICEL KAGAKU KOGYO KK under the trade name of '2021P') and a resin liquid obtained on dissolving 60 parts by weight of bisphenol A epoxy resin as an epoxy resin (manufactured and sold by YUKA SHELL EPOXY KK under the trade name of 'EP1009') in a solvent.

A paste-like first adhesive material is also provided. The first adhesive material was prepared by mixing 5 parts by weight of an epoxy silane coupling agent (manufactured and sold by SHIN-ETSU KAGAKU KOGYO KK under the trade name of 'KBM-403'), as a first curing agent, and 10 parts by weight of electrically conductive particles, to 100 parts by weight of the first resin component.

Apart from the first adhesive material, a paste-like second adhesive material was provided. The second adhesive material was prepared by mixing 2 parts by weight of ethylacetoacetate aluminum diisopropylate (a metal chelate manufactured and sold by KAWAKEN FINE CHEMICAL KK under the trade name of 'ALCH') and 10 parts by weight of electrically conductive particles to 100 parts by weight of the second resin component composed of the same resin materials in the same proportion as the first resin component.

The first and second adhesive materials were coated on the surface of the release film 21 and subsequently dried to form the first and second adhesive films 25, 35. As the release film 21, a PET film, surface-processed for peel-off, was used.

The first and second adhesive materials were coated on the release film 21 to an as-dried film thickness of the order of 10 μm.

Using these first and second adhesive films 25, 35, the LCD 11, as one of the objects for bonding, and the TCP 15, as the other object for bonding, were bonded together, by the above-described process shown in FIGS. 10 to 12, to produce the electrical device 10.

As the TCP 15, forming the electrical device 10 of Example 1, such TCP including a base film 16, on the surface of which plural second electrodes 17, each with a width of 25 μm, were formed at an interval of 25 μm, was used. As the LCD 11, such LCD carrying ITO (indium tin oxide) electrodes 13, with a sheet resistance per 1 $cm^2$ of surface area of 10 Ω, was used. A thermo-compression bonding head, kept at 120° C., was pressed for ten seconds to an area of superposition of the TCP 15 and the LCD 11 for thrusting under heating. In this manner, the first adhesive film 25 was heated to a temperature of 120° C. to unify the TCP 15 and the LCD 11 to prepare the electrical device 10.

EXAMPLE 2

The Example 2 of the two-component adhesive according to the present invention is explained.

The first and second paste-like resin components, used for the two-component adhesive of Example 2, were prepared by mixing 50 parts by weight of alicyclic epoxy resin celoxide (manufactured and sold by DICEL KAGAKU KOGYO KK under the trade name of '2021P') which is the same as that used in Example 1, and 50 parts by weight of bisphenol A type epoxy resin of a molecular weight lesser than that of the resin used in Example 1 (manufactured and sold by YUKA SHELL EPOXY KK under the trade name of 'EP1001'), were mixed together and stirred as the temperature was kept at 70° C.

The paste-like first adhesive material, used in the two-component adhesive of Example 2, is prepared by mixing 5 parts by weight of the same first curing agent as that used in Example 1 and 10 parts by weight of the electrically conductive particles with 100 parts by weight of the first resin component. The past-like second adhesive material, used in the two-component adhesive of Example 2, is prepared by mixing 2 parts by weight of the same second curing agent as that used in Example 1 and 10 parts by weight of the electrically conductive particles with 100 parts by weight of the second resin component.

Figure 15:
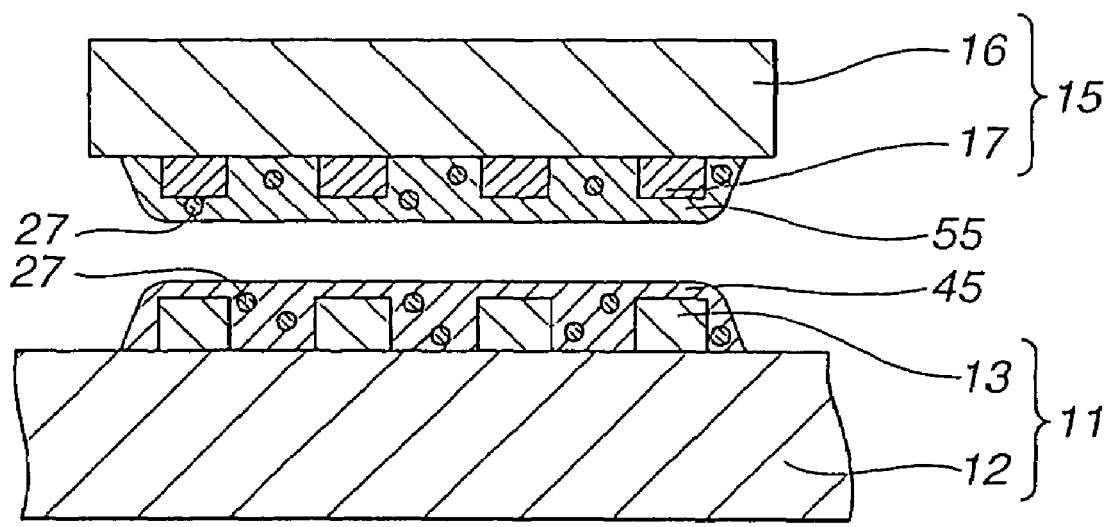
FIG. 15 is a cross-sectional view showing the state in which an LCD carrying a first coating layer and a TCP carrying a second coating layer have been placed in position for facing each other.

Using these first and second adhesive materials, the LCD 11, as one of the objects for bonding, was bonded to the TCP 15, as the other object for bonding, through the process shown in FIGS. 15 and 16, to produce an electrical device 50 of Example 2.

COMPARATIVE EXAMPLES 1 AND 2

For comparison to the two-component adhesive of the present invention, the Comparative Examples were prepared. These Comparative Examples are hereinafter explained.

The Comparative Example 1 was constructed as an adhesive film, as in the Example 1 described above. 2 parts by weight of the second curing agent, used in Example 1, are added to and mixed with 115 parts by weight of the paste-like adhesive material prior to being formed to a film prepared in Example 1, to prepare a paste-like adhesive containing both the first and second curing agents. This adhesive was coated to the release film, used in Example 1, and dried in situ, to prepare an adhesive film with a film thickness of 20 μm.

Using the adhesive film of the Comparative Example 1, the LCD 11 and the TCP 15 were bonded together to prepare an electrical device of Comparative Example 1. This electrical device was prepared under heating and thrusting of the same conditions as those of Example 1, as the adhesive was sandwiched between the LCD and the TCP, as in the Example 1 described above.

The Comparative Example 2 is now explained. With the Comparative Example 2, 2 parts by weight of the second curing agent, used in Example 2, were added to and mixed with 115 parts by weight of the paste-like first adhesive material, prepared in the Example 2 above, to prepare a paste-like adhesive. Using this adhesive of the Comparative Example 2, the LCD 11 and the TCP 15 were bonded together to form an electrical device of the Comparative Example 2. This electrical device was prepared by heating and thrusting, under the same conditions as those of Example 1, with the adhesive sandwiched between the LCD and the TCP, as in the Example 2 described above.

A 'peel-off strength test', described below, was conducted for each of the electrical devices 10 and 50 of Examples 1 and 2 and for each of the electrical devices of the Comparative Examples 1 and 2.

Peel-Off Strength Test

Using a tensile tester, the TCP 15 of an electrical device, composed of the TCP 15 and the LCD 11, bonded to each other using an adhesive of each of the Examples and the Comparative Examples, was pulled in a direction of 90° relative to the plane direction of the LCD 11, at a rate of 50 mm/min, and measurement was made of the peel-off strength, in terms of N/cm, when the TCP 15 is peeled off from the LCD 11. The results of measurement of the peel-off strength test of the Examples and the Comparative Examples are shown in the following Table 1.

TABLE 1

Results of Peel-off Strength Test

| | Ex. 1 | Ex. 2 | Comp. Ex. 1 | Comp. Ex. 2 |
|---|---|---|---|---|
| peel-off strength (N/cm) | 12.8 | 15.9 | 1.3 | 1.3 |

As may be seen from the results of table 1, with the Examples 1 and 2, in which the first adhesive material having the first curing agent and the second adhesive material having the second curing agent, were prepared separately, the peel-off strength was high despite the fact that the adhesive was cured under a condition of a lower temperature and a shorter time (120° C. and ten seconds) than conventionally, thus testifying to high curing properties of the two-component adhesive of the present invention.

With the Comparative Examples 1 and 2, in which the first and second curing agents are not isolated from each other such that the first and second curing agents are added to the same adhesive, the peel-off strength was so low that the ultimate device could hardly be put to practical use. The reason therefor is presumably that the viscosity of the adhesive is gradually increased by the reaction of the first and second curing agents, as from the time of manufacture of the adhesive, thus leading to loss of the adhesive properties of the adhesive, prior to thrusting under heating of the TCP and the LCD.

It is seen from these results that, by isolating the silane coupling agent and the metal chelate from each other prior to use, the adhesive is superior in shell life and in post-curing peeling strength of the adhesive, regardless of whether the first and second adhesive materials are in the form of films or pastes.

The above refers to a case where the first electrode 13 and the second electrode 17 are electrically and mechanically interconnected via electrically conductive particles 27. The present invention is, however, not limited to this embodiment. For example, it is possible to prepare the first and second adhesive materials, without adding the electrically conductive particles into the adhesive materials, and to directly abut the second electrode against the first electrode during the time of thrusting under heating to interconnect the first and second electrodes. In case the electrically conductive particles 27 are used, it is sufficient that the electrically conductive particles 27 are added to one of the first and second adhesive materials.

The above refers to a case in which the silane coupling agent is used as the first curing agent and a metal chelate or a metal alcoholate is used as the second curing agent. The present invention is, however, not limited to this case, such that, for example, it is possible to use the metal chelate or the metal alcoholate as the first curing agent and to use the silane coupling agent as the second curing agent.

The metal chelates or alcoholates that may be used may contain a variety of center atoms, such as atoms of zirconium, titanium or aluminum. Of these, aluminum chelates or aluminum alcoholates, having aluminum, exhibiting particularly high reactivity, as the center atoms, are most preferred.

There is no limitation to the sort of the ligands of the aluminum chelate or to the sort of the alkoxyl groups of the aluminum alcoholates. For example, aluminum tris ethyl acetoacetate, alkyl aceto acetate aluminum diisopropylate, aluminum monoacetyl acetonate bis ethyl acetoacetate, or aluminum tris acetyl acetonate, may be used as the aluminum chelate, in addition to ethyl acetoacetate aluminum diiropropylate used in the aforementioned Examples 1 and 2.

As the silane coupling agent, a compound shown by the following general formula (5):

general formula (5)

is preferably employed.

Of the substituents $X^1$ to $X^4$ in the general formula (5), at least one substituent is an alkoxy group. At least one of the substituents $X^1$ to $X^4$ other than the alkoxy group preferably contains an epoxy ring or a vinyl group. As the substituent having the epoxy ring, a glycidyl group is most preferred.

In the foregoing, a case in which the same sort of resin is used for the first and second resin components has been explained. The present invention is, however, not limited to this embodiment, such that respective different resins may also be used.

The resins used for the first and second resin components are not limited to the epoxy resin. That is, any resins that may be independently polymerized by cations as a curing component, for example, urea resin, melaminic resin, phenolic resin, vinylether resin or oxycetane resin, may be used. The epoxy resin is preferred in view of the strength of the resin following thermal curing.

As the first and second resin components, thermoplastic resins may be used, in addition to the cationic polymerized resin. The thermoplastic resins may be enumerated by, for example, phenoxy resin, polyester resin, polyurethane resin, polyvinyl acetal, ethylenevinyl acetate, and rubbers, such as polybutadiene rubber. A wide variety of additives, such as anti-ageing agents, fillers or colorants, may be added to the first and second adhesive materials.

In case the first and second adhesive materials are paste-like, these may be coated to objects for bonding, such as TCP or LCD, using e.g. a dispenser. Although the foregoing refers to the case of bonding the LCD 11 to the TCP 15 together, this is merely illustrative, such that the two-component adhesive of the present invention may be used for interconnecting a variety of circuit substrates, such as semiconductor chip or flexible circuit board.

Although the foregoing refers to the case of separately bonding the first and second adhesive materials, this again is merely illustrative and the present invention is not limited to this case. When the first and second adhesive materials are mixed together, the curing reaction does not occur for several minutes, if under an ambient temperature condition, so that the adhesive materials may be coated to the objects for bonding after mixing the first and second adhesive materials.

The present invention is not limited to the embodiments described with reference to the drawings and, as may be apparent to those skilled in the art, various changes, substitutions or equivalents may be envisaged without departing from the scope and the purport of the invention as defined in the appended claims.

INDUSTRIAL APPLICABILITY

With the two-component adhesive, according to the present invention, described above, in which the epoxy resin undergoes cationic polymerization by the reaction of the silane coupling agent with the metal chelate, the first and second adhesive materials may be cured at a lower temperature in a shorter time than with the conventional adhesive. Since the first and second curing agents are added to respective distinct adhesive materials, no polymerization reaction of the first and second resin components occurs prior to use of the two-component adhesive, thus assuring high shell life as the adhesive.

The invention claimed is:

1. A two-component anisotropic electrically conductive adhesive film comprising:
   a first adhesive material composed of a first resin component with a first curing agent added therein;
   a second adhesive material composed of a second resin component with a second curing agent added therein, and set apart from said first adhesive material;
   said first and second adhesive materials being respectively coated on release films to yield sheet forms, at least one of said sheet forms having electrically conductive particles added thereto;
   said first and second resin components being formed of epoxy resin;
   one of the first and second curing agents is composed of a silane coupling agent and the other is composed of one or both of an aluminum chelate and an aluminum alcoholate that reacts with said silane coupling agent to yield cations; and wherein
   when said first and second adhesive materials are contacted and mixed with each other under heating and pressurization, said first and second curing agents react with each other to cause a chain reaction of said cations to cause polymerization of said first and second resin components by said cations.

2. The two-component anisotropic electrically conductive adhesive film according to claim 1 wherein said aluminum chelate is one of ethyl acetoacetate aluminum diisopropylate, alkyl acetoacetate aluminum diisopropylate and aluminum monoacetyl acetonate bis ethylacetoacetate.

3. The two-component anisotropic electrically conductive adhesive film according to claim 1 wherein, as said silane coupling agent, a compound shown by the following formula:

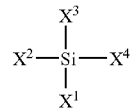

is used, where at least one of the substituents $X^1$ to $X^4$ is an alkoxy group and at least one of the substituents different from the alkoxy group includes an epoxy ring.

4. The two-component anisotropic electrically conductive adhesive film according to claim 1 wherein, as said silane coupling agent, a compound shown by the following formula:

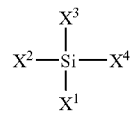

is used, where at least one of the substituents $X^1$ to $X^4$ is an alkoxy group and at least one of the substituents different from the alkoxy group includes an epoxy ring, and where said substituent including the epoxy ring is a glycidyl group.

5. A method for producing a continuously connected member, comprising:
   forming a two-component anisotropic electrically conductive adhesive film by coating on release films a first adhesive material and a second adhesive material to yield a sheet form of the first adhesive material and a sheet form of the second adhesive material, respectively; and
   heating and pressing to each other the first and second adhesive materials to form said continuously connected member,
   wherein the first adhesive material is obtained by adding a first curing agent to a first resin component, and the second adhesive material is obtained by adding a second curing agent to a second resin component, at least one of said first and second adhesive materials having electrically conductive particles added thereto, wherein said first and second resin components are formed of an epoxy resin;

wherein one of said first and second curing agents is composed of a silane coupling agent, with the other curing agent being composed of one or both of aluminum chelate and aluminum alcoholate that react with said silane coupling agent to yield cations; and wherein during the heating and pressurizing, said first and second adhesive materials are contacted and mixed with each other to react with each other to cause a chain reaction of said cations to cause polymerization of said first and second resin components by said cations.

6. The two-component anisotropic electrically conductive adhesive film according to claim 5 wherein said aluminum chelate is one of ethyl acetoacetate aluminum diisopropylate, alkyl acetoacetate aluminum diisopropylate and aluminum monoacetyl acetonate bis ethylacetoacetate.

7. The two-component anisotropic electrically conductive adhesive film according to claim 5 wherein, as said silane coupling agent, a compound shown by the following formula:

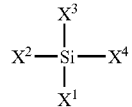

is used, where at least one of the substituents $X^1$ to $X^4$ is an alkoxy group and at least one of the substituents different from the alkoxy group includes an epoxy ring.

8. The two-component anisotropic electrically conductive adhesive film according to claim 5 wherein, as said silane coupling agent, a compound shown by the following formula:

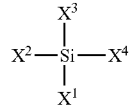

is used, where at least one of the substituents $X^1$ to $X^4$ is an alkoxy group and at least one of the substituents different from the alkoxy group includes an epoxy ring, and where said substituent including the epoxy ring is a glycidyl group.

9. A continuously connected member in which a first adhesive material obtained on adding a first curing agent to a first resin component and a second adhesive material obtained on adding a second curing agent to a second resin component, at least one of said first and second adhesive materials having electrically conductive particles added thereto, are respectively coated on release films to yield a sheet form of the first adhesive material and a sheet form of the second adhesive material to form a two-component anisotropic electrically conductive adhesive film; and in which said first and second adhesive materials are heated and pressurized to each other to form said continuously connected member;

wherein said first and second resin components are formed of an epoxy resin;

wherein one of said first and second curing agents is composed of a silane coupling agent, with the other curing agent being composed of one or both of aluminum chelate and aluminum alcoholate that react with said silane coupling agent to yield cations; and wherein said first and second adhesive materials are contacted and mixed with each other during heating and pressurization, said first and second curing agent being reacted with each other to cause a chain reaction of said cations to cause polymerization of said first and second resin components by said cations.

10. The two-component anisotropic electrically conductive adhesive film according to claim 9 wherein said aluminum chelate is one of ethyl acetoacetate aluminum diisopropylate, alkyl acetoacetate aluminum diisopropylate and aluminum monoacetyl acetonate bis ethylacetoacetate.

11. The two-component anisotropic electrically conductive adhesive film according to claim 9 wherein, as said silane coupling agent, a compound shown by the following formula:

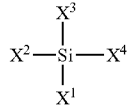

is used, where at least one of the substituents $X^1$ to $X^4$ is an alkoxy group and at least one of the substituents different from the alkoxy group includes an epoxy ring.

12. The two-component anisotropic electrically conductive adhesive film according to claim 9 wherein, as said silane coupling agent, a compound shown by the following formula:

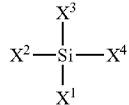

is used, where at least one of the substituents $X^1$ to $X^4$ is an alkoxy group and at least one of the substituents different from the alkoxy group includes an epoxy ring, and where said substituent including the epoxy ring is a glycidyl group.

* * * * *

UNITED STATES PATENT AND TRADEMARK OFFICE
CERTIFICATE OF CORRECTION

PATENT NO. : 7,491,290 B2
APPLICATION NO. : 10/505489
DATED : February 17, 2009
INVENTOR(S) : Takayuki Matsushima et al.

It is certified that error appears in the above-identified patent and that said Letters Patent is hereby corrected as shown below:

In Claim 10, column 14, line 23, the word "his" should read --bis--.

Signed and Sealed this

Fourteenth Day of April, 2009

JOHN DOLL
*Acting Director of the United States Patent and Trademark Office*